United States Patent
Kim

(10) Patent No.: US 8,351,257 B2
(45) Date of Patent: Jan. 8, 2013

(54) SEMICONDUCTOR MEMORY DEVICE AND METHOD OF READING THE SAME

(75) Inventor: Jae Yun Kim, Jeollanam-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 216 days.

(21) Appl. No.: 12/982,185

(22) Filed: Dec. 30, 2010

(65) Prior Publication Data

US 2012/0033498 A1 Feb. 9, 2012

(30) Foreign Application Priority Data

Aug. 4, 2010 (KR) ........................ 10-2010-0075248

(51) Int. Cl.
*G11C 16/04* (2006.01)
(52) U.S. Cl. ............................... 365/185.03; 365/185.18
(58) Field of Classification Search ............. 365/185.03, 365/185.18, 185.21; 711/103, 104
See application file for complete search history.

(56) References Cited

U.S. PATENT DOCUMENTS

2008/0162789 A1* 7/2008 Choi et al. .................... 711/103
2011/0299335 A1* 12/2011 Lee et al. ................. 365/185.03

FOREIGN PATENT DOCUMENTS

KR 1020100054479 5/2010

OTHER PUBLICATIONS

Notice of Preliminary Rejection issued from Korean Intellectual Property Office on Sep. 30, 2011.

* cited by examiner

*Primary Examiner* — Vu Le
(74) *Attorney, Agent, or Firm* — IP & T Group LLP

(57) ABSTRACT

A semiconductor memory device comprises planes each configured to comprise flag cells storing data about program methods of memory cells of the plane, page buffer units configured to sense the data of the flag cells, a flag cell data detection circuit configured to make a determination of program methods of the planes on the basis of a result, obtained by comparing the sensed data of the flag cells of the planes, and the sensed data of the flag cells, and a microcontroller configured to control the page buffer units, wherein the page buffer units read least significant bit (LSB) data of the planes or both the least significant bit (LSB) data and most significant bit (MSB) data on the basis of the determination of the flag cell data detection circuit.

17 Claims, 5 Drawing Sheets

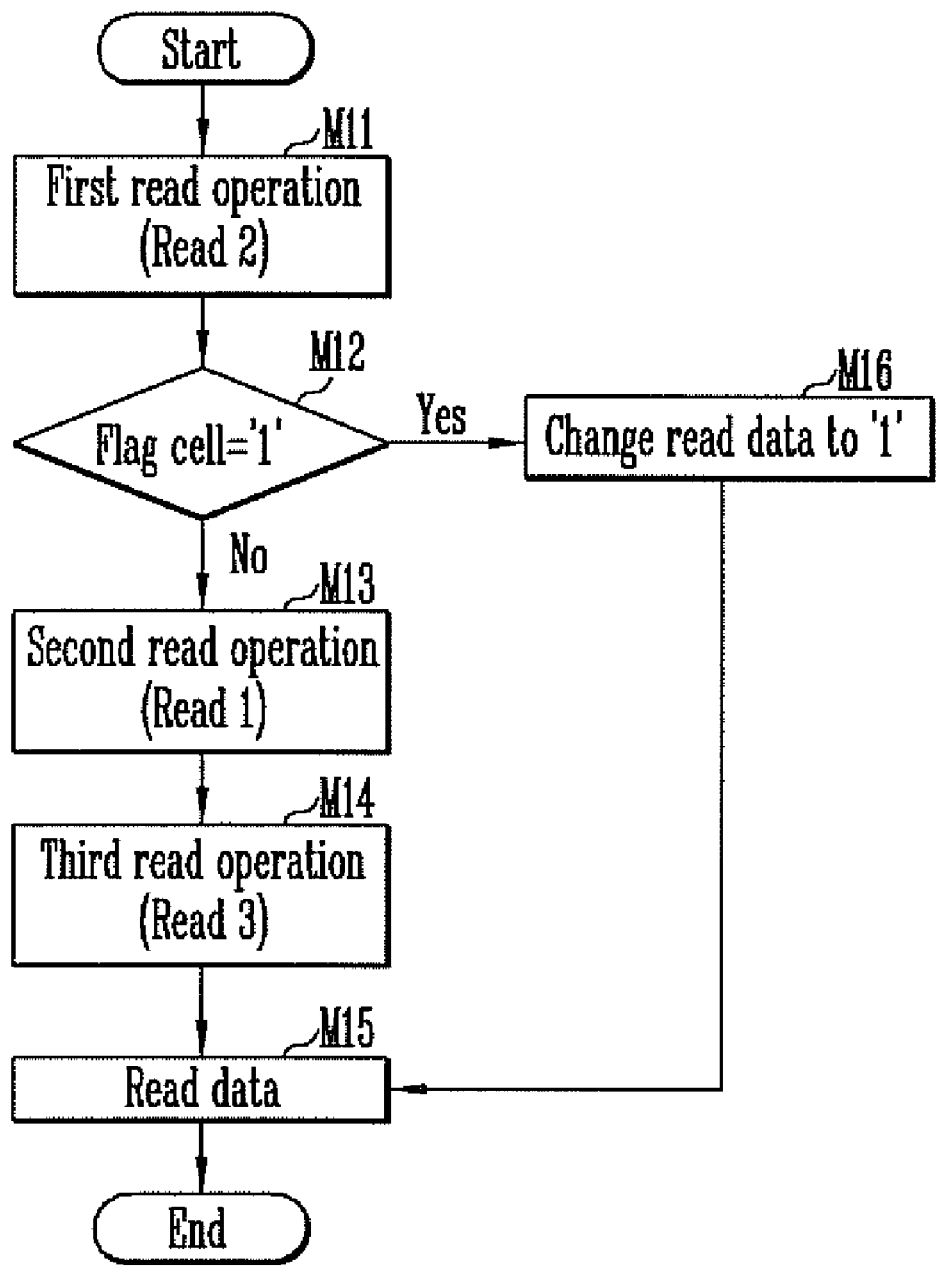

US 8,351,257 B2

SEMICONDUCTOR MEMORY DEVICE AND METHOD OF READING THE SAME

CROSS-REFERENCE TO RELATED APPLICATION

Priority to Korean patent application number 10-2010-0075248 filed on Aug. 4, 2010, the entire disclosure of which is incorporated by reference herein, is claimed.

BACKGROUND

Exemplary embodiments relate to a semiconductor memory device and a method of reading data from the same and, more particularly, to a semiconductor memory device including a plurality of planes programmed by using different program methods and a method of reading the semiconductor memory device.

FIG. 1 is a diagram showing the distributions of threshold voltages of planes programmed by using different program methods.

Referring to FIG. 1, a plane programmed using only a single bit program method (that is, the least significant bit (LSB) program method) has two threshold voltage distributions; a threshold voltage distribution corresponding to data '1' and a threshold voltage distribution corresponding to data '0'. Here, data '11', indicating that the single bit program operation has been performed, is programmed into the flag cell of the plane.

On the other hand, a plane programmed using a multi-bit program method (that is, the least significant bit (LSB) program and the most significant bit (MSB) program) has three or more threshold voltage distributions. For example, in case where data of 2 bits is programmed into one memory cell, a plane has threshold voltage distributions A, B, C, and D, as shown in the drawing. Here, data '10', indicating that the multi-bit program operation has been performed, is programmed into the flag cell of the plane.

FIG. 2A is a flowchart illustrating a data read method for the least significant bit (LSB) page of a semiconductor memory device.

The read method of the semiconductor memory device including first and second planes is described below with reference to FIGS. 1 and 2A.

Data of the memory cells and the flag cells of the first and second planes is sensed by performing a first read operation using a read voltage RD2 at step L11. It is determined whether the least significant bit (LSB) data of the sensed flag cells is '1' at step L12. Here, if the flag cells of the first and second planes have different data, the data of a flag cell of the second plane is first selected, and a subsequent operation is performed on the second plane. If, as a result of the determination, the least significant bit (LSB) data of the sensed flag cells is determined not to be '1' (that is, determined to be '0'), the first and second planes are determined to have been programmed using a multi-bit program method. Next, data of the memory cells of the first and second planes, read by the first read operation, is outputted at step L13.

Meanwhile, if, as a result of the determination at step L12, the least significant bit (LSB) data of the sensed flag cells is determined to be '1', the first and second planes are determined to have been programmed using a single bit program method. Thus, the least significant bit (LSB) data of the memory cells of the first and second planes is sensed by performing a second read operation using a read voltage RD1 at step L14. Next, data of the memory cells of the first and second planes, read by the second read operation, is outputted at step L13.

FIG. 2B is a flowchart illustrating a data read method for the most significant bit (MSB) page of a semiconductor memory device.

The read method of the semiconductor memory device including first and second planes is described below with reference to FIGS. 1 and 2B.

Data of the memory cells and the flag cells of the first and second planes is sensed by performing a first read operation using a read voltage RD2 at step M11. It is determined whether the least significant bit (LSB) data of the sensed flag cells is '1' at step M12. Here, if the flag cells of the first and second planes have different data, the data of a flag cell of the second plane is first selected, and a subsequent operation is performed on the second plane. If, as a result of the determination, the least significant bit (LSB) data of the sensed flag cells is determined not to be '1' (that is, '0'), the first and second planes are determined to have been programmed using a multi-bit program method. Accordingly, the data of the memory cells of the first and second planes is read by performing a second read operation using a read voltage RD1 at step M13. Next, data of the memory cells of the first and second planes is read by performing a third read operation using a read voltage RD3 at step M14. The data of the first to third read operations is combined, and multi-bit data of the memory cells of the first and second planes is outputted at step M15.

Meanwhile, if, as a result of the determination at step M12, the least significant bit (LSB) data of the sensed flag cells is determined to be '1', the first and second planes are determined to have been programmed using a single bit program method. Both the data of memory cells of the first and second planes, read by the first read operation, is changed to '1' at step M16. Next, step M15 is performed.

In the above-described known read method of the semiconductor memory device, in case where the first and second planes have been programmed by using different program methods, a read algorithm is determined according to the data of a flag cell of the second plane. Here, the data of a plane programmed using a single bit program method is read by using a multi-bit read algorithm or the data of a plane programmed using a multi-bit program method is read by using a single bit read algorithm.

BRIEF SUMMARY

Exemplary embodiments relate to a semiconductor memory device and a method of reading the same, wherein when a read operation is performed on the semiconductor memory device including first and second planes, the first and second planes are determined to have been programmed using the same method by comparing the data of flag cells of the first and second planes, and a read method corresponding to the program method of each of the first and second planes is used.

A semiconductor memory device according to an aspect of the present disclosure comprises planes each configured to comprise flag cells storing data about program methods of memory cells of the plane, page buffer units configured to sense the data of the flag cells, a flag cell data detection circuit configured to make a determination of program methods of the planes on the basis of a result, obtained by comparing the sensed data of the flag cells of the planes, and the sensed data of the flag cells, and a microcontroller configured to control the page buffer units, wherein the page buffer units read least significant bit (LSB) data of the planes or both the least significant bit (LSB) data and most significant bit (MSB) data on the basis of the determination of the flag cell data detection circuit.

A read method of a semiconductor memory device according to another aspect of the present disclosure comprises receiving a least significant bit (LSB) page address; sensing data of memory cells and data of flag cells that indicates program methods of first and second planes, by performing a first read operation and storing the sensed data in first and second page buffer units; making a determination of whether the first and second planes have been programmed using an identical program method by comparing the data of the flag cells of the first and second planes; in response to determining that the first and second planes have been programmed using the identical program method, reading least significant bit (LSB) data of the first and second planes by performing an identical read operation on the first and second planes; and in response to determining that the first and second planes have been programmed using different program methods, reading the least significant bit (LSB) data of the first and second planes by performing different read operations on the first and second planes.

A read method of a semiconductor memory device according to another aspect of the present disclosure comprises receiving a most significant bit (MSB) page address; sensing data of memory cells and data of flag cells of first and second planes by performing a first read operation and storing the sensed data in first and second page buffer units; making a determination of whether the first and second planes have been programmed using an identical program method by comparing the data of the flag cells of the first and second planes; in response to determining that the first and second planes have been programmed using the identical program method, reading most significant bit (MSB) data of the first and second planes by performing an identical read operation on the first and second planes; and in response to determining that the first and second planes have been programmed using different program methods, reading the most significant bit (MSB) data of the first and second planes by performing different read operations on the first and second planes, respectively.

BRIEF DESCRIPTION OF THE DRAWINGS

FIGS. 2A and 2B are flowcharts illustrating a method of reading a semiconductor memory device;

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 3:
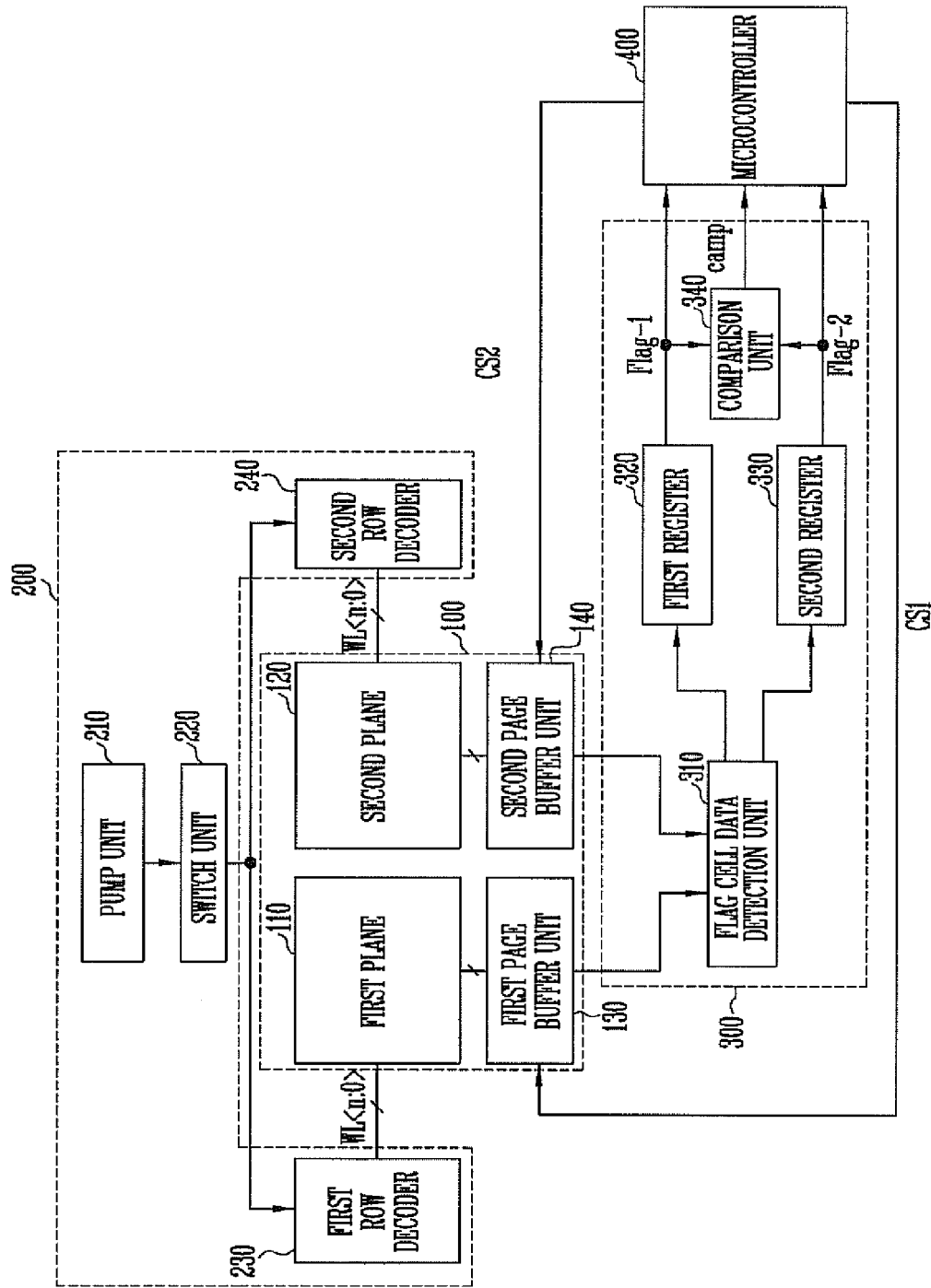
FIG. 3 is a block diagram of a semiconductor memory device according to an exemplary embodiment of this disclosure.

FIG. 3 is a block diagram of a semiconductor memory device according to an exemplary embodiment of this disclosure.

Referring to FIG. 3, the semiconductor memory device includes a memory unit 100, a voltage supply circuit 200, a flag cell data detection circuit 300, and a microcontroller 400.

The memory unit 100 includes a plurality of planes and a plurality of page buffer units corresponding to respective ones of the plurality of planes. According to an example, the memory unit 100 includes a first plane 110 and a second plane 120. Each of the first plane 110 and the second plane 120 includes a plurality of memory cells and flag cells.

A first page buffer unit 130 and a second page buffer unit 140 correspond to the first plane 110 and the second plane 120, respectively. The first page buffer unit 130 senses data of the memory cells and data of the flag cells, of the first plane 110, and temporarily stores the sensed data in a plurality of latches. The second page buffer unit 140 senses data of the memory cells and data of the flag cells, of the second plane 120, and temporarily stores the sensed data in a plurality of latches.

The voltage supply circuit 200 includes a pump unit 210, a switch unit 220, and first and second row decoders 230, 240. The pump unit 210 generates a read voltage and a pass voltage which are used in a read operation. The switch unit 220 sends the read voltage and the pass voltage to the first and second row decoders 230, 240. The first and second row decoders 230, 240 supply the read voltage and the pass voltage to a plurality of word lines WL<n:0> of the first and second planes 110, 120.

The flag cell data detection circuit 300 determines the program methods of the first and second planes 110, 120 (that is, whether they have been programmed using a single level cell method or a multi-level cell method) by comparing the data of the flag cells and the data of the flag cells, sensed by the first page buffer unit 130 and the second page buffer unit 140.

The flag cell data detection circuit 300 includes a flag cell data detection unit 310, first and second registers 320, 330, and a comparison unit 340. The flag cell data detection unit 310 receives the data of the flag cells corresponding to the first and second page buffer units 130, 140 and sends the received data to the first and second registers 320, 330. The first and second registers 320, 330 stores the received data of the flag cells and outputs them as first and second flag cell data signals Flag-1 and Flag-2. The comparison unit 340 determines whether the first and second flag cell data signals Flag-1 and Flag-2 are the same logic signal by comparing the first and second flag cell data signals Flag-1 and Flag-2 and outputs a comparison signal camp.

The microcontroller 400 outputs a first control signal CS1 and a second control signal CS2 controlling the first page buffer unit 130 and the second page buffer unit 140, respectively, in response to the first and second flag cell data signals Flag-1 and Flag-2 and the comparison signal camp.

Figure 4:
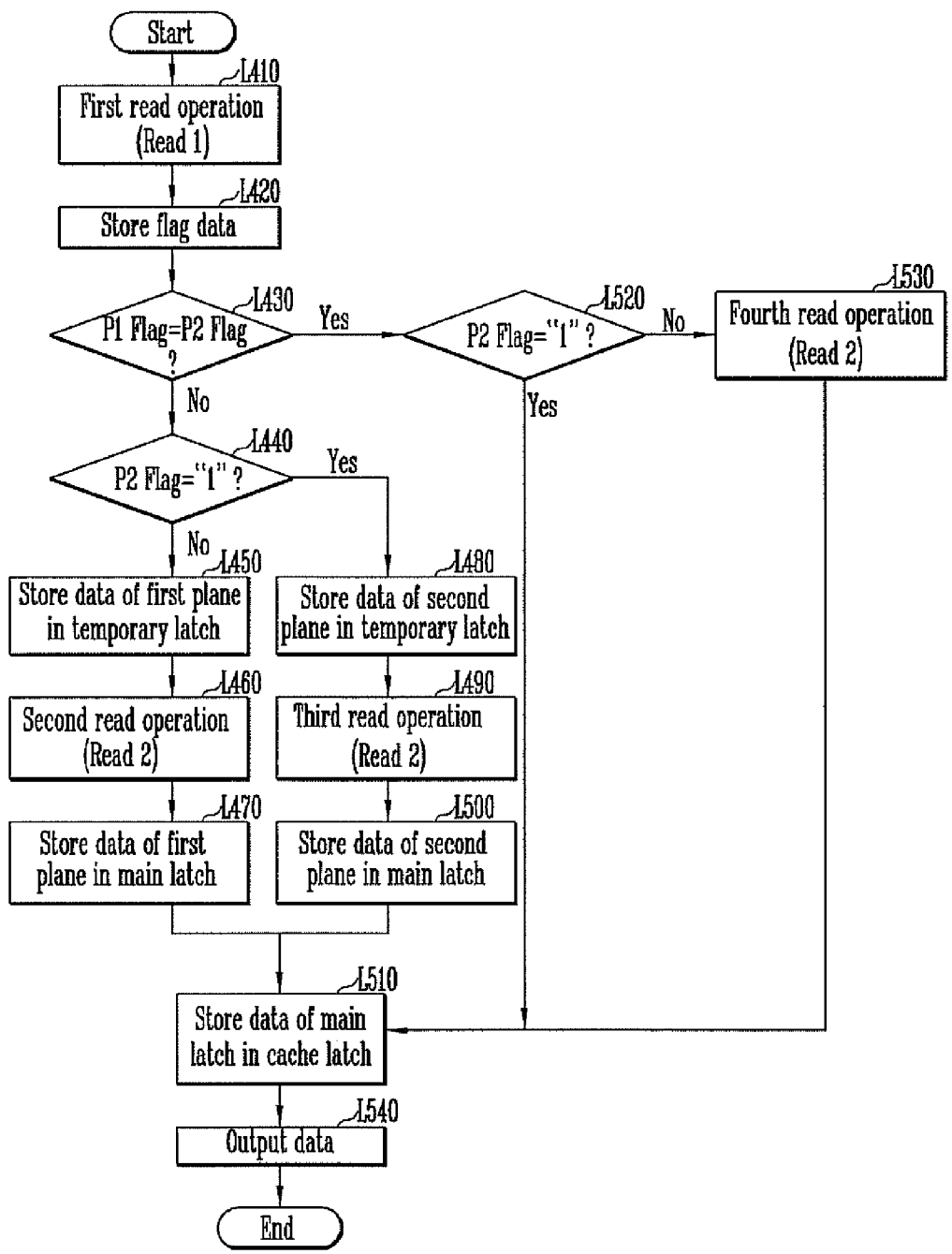
FIG. 4 is a flowchart illustrating a read method for the least significant bit (LSB) pages of the semiconductor memory device according to an exemplary embodiment of this disclosure.

FIG. 4 is a flowchart illustrating a read method for the least significant bit (LSB) pages of the semiconductor memory device according to an exemplary embodiment of this disclosure.

Figure 1:
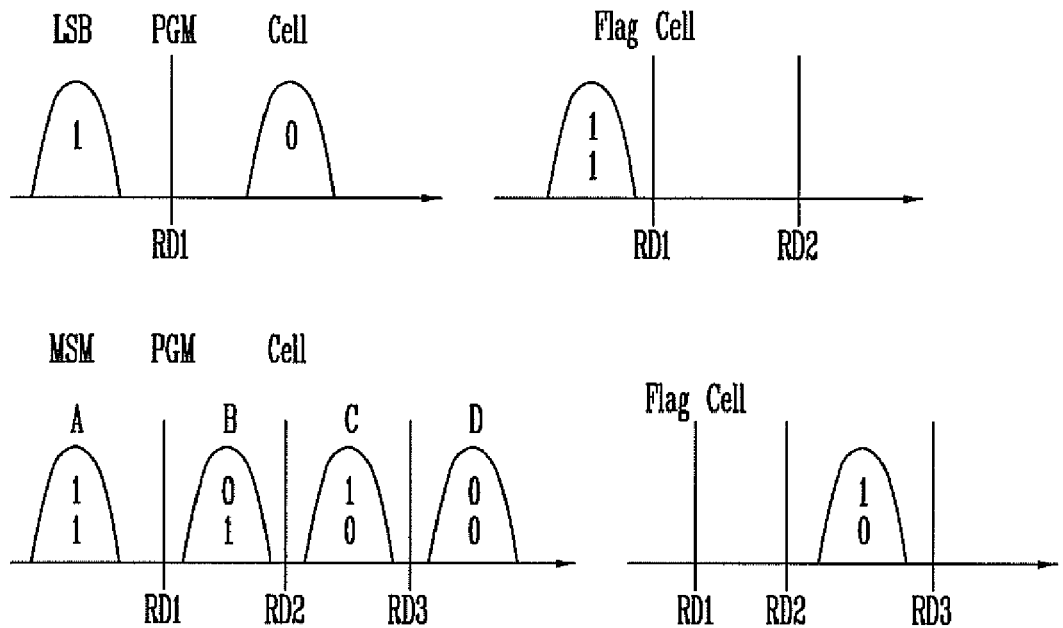
FIG. 1 is a diagram showing the distributions of threshold voltages of planes programmed by using different program methods.
Figure 2A:
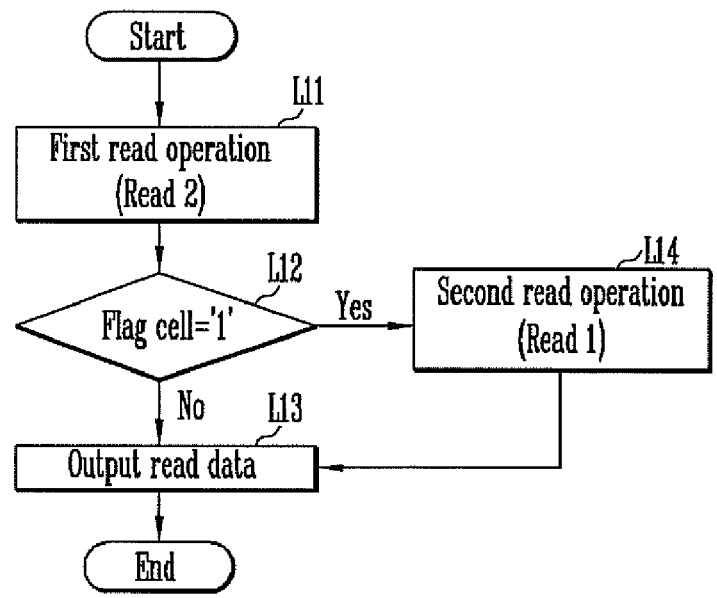

The read method of the least significant bit (LSB) pages according to the exemplary embodiment of this disclosure is described below with reference to FIGS. 1, 3, and 4.

(1) First Read Operation—L410

When a least significant bit (LSB) page address is inputted to the semiconductor memory device, a read operation is performed on the least significant bit (LSB) pages of the first and second planes 110, 120.

First, data of the memory cells and the flag cells of the first and second planes 110, 120 is sensed by performing a first read operation using a first read voltage RD1. Here, the pages of the first and second planes 110, 120, having the same page address, are selected and the data of the memory cells and the flag cells of the selected pages is sensed. The sensed data of the memory cells and the flag cells is temporarily stored in the respective main latches of the first and second page buffer units 130, 140.

(2) Store Data of Flag Cells—L420

The data of the flag cells stored in the main latches of the first and second page buffer units 130, 140 is sent to the flag cell data detection unit 310. The flag cell data detection unit 310 sends the received data of the flag cells to the first register 320 and the second register 330, respectively. That is, the data of the flag cells of the first plane 110 is stored in the first register 320, and the data of the flag cells of the second plane 120 is stored in the second register 330.

(3) Compare Data of Flag Cells of First Plane and Data of Flag Cells of Second Plane—L430

The comparison unit 340 determines whether the flag cell data signal Flag-1, indicating the data of the flag cells of the first plane 110 stored in the first register 320, and the flag cell data signal Flag-2, indicating the data of the flag cells of the second plane 120 stored in the second register 330, have the same value and output the comparison signal camp. For example, if, as a result of the determination, the flag cell data signal Flag-1 and the flag cell data signal Flag-2 are determined to have the same value, the comparison unit 340 outputs the comparison signal camp of a high level. However, if, as a result of the determination, the flag cell data signal Flag-1 and the flag cell data signal Flag-2 are determined to have different values, the comparison unit 340 outputs the comparison signal camp of a low level.

(4) Determine Data of Flag Cells of Second Plane—L440

If, as a result of the determination at step L430, the flag cell data signal Flag-1 and the flag cell data signal Flag-2 are determined to have different values, it is determined whether the sensed data of the flag cells of the second plane 120 is '1'.

(5) Store Data of First Plane in Temporary Latch of First Page Buffer Unit—L450

If, as a result of the determination at step L440, the sensed data of the flag cells of the second plane 120 is determined not to be '1' (that is, '0'), it means that the first plane 110 has been programmed by using a least significant bit (LSB) program method, and the second plane 120 has been programmed by sequentially using a least significant bit (LSB) program method and a most significant bit (MSB) program method.

In this case, the data of the memory cells stored in the main latch of the first page buffer unit 130 is stored in the temporary latch.

(6) Perform Second Read Operation—L460

A second read operation using a second read voltage RD2. More specifically, data of the memory cells of the first and second planes 110, 120 is sensed and stored in the respective main latches of the first and second page buffer units 130, 140. The second read operation using the second read voltage RD2 is performed to read the least significant bit (LSB) data of a memory cell on which a least significant bit (LSB) program and a most significant bit (MSB) program have been sequentially performed.

(7) Send Data of Temporary Latch of First Plane to Main Latch—L470

After the second read operation L460, the data stored in the temporary latch of the first page buffer unit 130 is stored in the main latch. Accordingly, the data sensed by the first read operation is stored in the main latch of the first page buffer unit 130.

(8) Store Data of Second Plane in Temporary Latch of Second Page Buffer Unit—L480

Meanwhile, if, as a result of the determination at step L440, the sensed data of the flag cells of the second plane 120 is determined to be '1', it means that the first plane 110 has been programmed by sequentially using a least significant bit (LSB) program method and a most significant bit (MSB) program method, and the second plane 120 has been programmed by using a least significant bit (LSB) program method.

In this case, the data of the memory cells of the second plane, stored in the main latch of the second page buffer unit 140, is stored in the temporary latch of the second page buffer unit 140.

(9) Perform Third Read Operation—L490

A third read operation using a second read voltage RD2 is performed. More specifically, data of the memory cells of the first and second planes 110, 120 is sensed and stored in the respective main latches of the first and second page buffer units 130, 140. The third read operation using the second read voltage RD2 is performed to read the least significant bit (LSB) data of a memory cell on which a least significant bit (LSB) program and a most significant bit (MSB) program have been sequentially performed.

(10) Store Data of Second Plane in Main Latch of Second Page Buffer Unit—L500

After the third read operation L490, the data stored in the temporary latch of the second page buffer unit 140 is stored in the main latch of the second page buffer unit 140. The data sensed by the first read operation L410 is stored in the main latch of the second page buffer unit 140.

(11) Store Data of Main Latches of First and Second Page Buffer Units in Cache Latches—L510

After the steps L470 and L500, the data of the first plane 110 and the second plane 120, stored in the main latches of the first and second page buffer units 130, 140, are stored in the cache latches of the first and second page buffer units 130, 140.

(12) Determine Data of Second Plane—L520

Meanwhile, if, as a result of the determination at step L430, the flag cell data signal Flag-1 and the flag cell data signal Flag-2 are determined to have the same value, it is determined whether the data stored in the flag cells of the second plane 120 is '1'. If, as a result of the determination, the data stored in the flag cells of the second plane 120 is determined to be '1', it means that the first and second planes 110 and 120 have been programmed by using a least significant bit (LSB) program method. In this case, the step L510 is performed. That is, the data sensed by the first read operation L410 is stored in the respective main latches of the first and second page buffer units 130, 140 and then stored in the cache latches of the first and second page buffer units 130, 140.

(13) Fourth Read Operation—L530

If, as a result of the determination at step L520, the data stored in the flag cells of the second plane 120 is determined not to be '1' (that is, determined to be '0'), it means that the first and second planes 110 and 120 have been programmed by sequentially using a least significant bit (LSB) program method and a most significant bit (MSB) program method. In this case, a fourth read operation using a second read voltage RD2 is performed. That is, the data of the memory cells stored in the first and second planes 110, 120 is sensed by performing the fourth read operation and respectively stored in the first and second page buffer units 130, 140. The fourth read operation using the second read voltage RD2 is performed to read least significant bit (LSB) data of a memory cell on which a least significant bit (LSB) program and a most significant bit (MSB) program have been sequentially performed. Next, the process returns to step L510.

(14) Output Data—L540

After step L510, the data of the first plane 110 and the second plane 120, stored in the cache latches of the first and second page buffer units 130, 140, is outputted.

Figure 5:
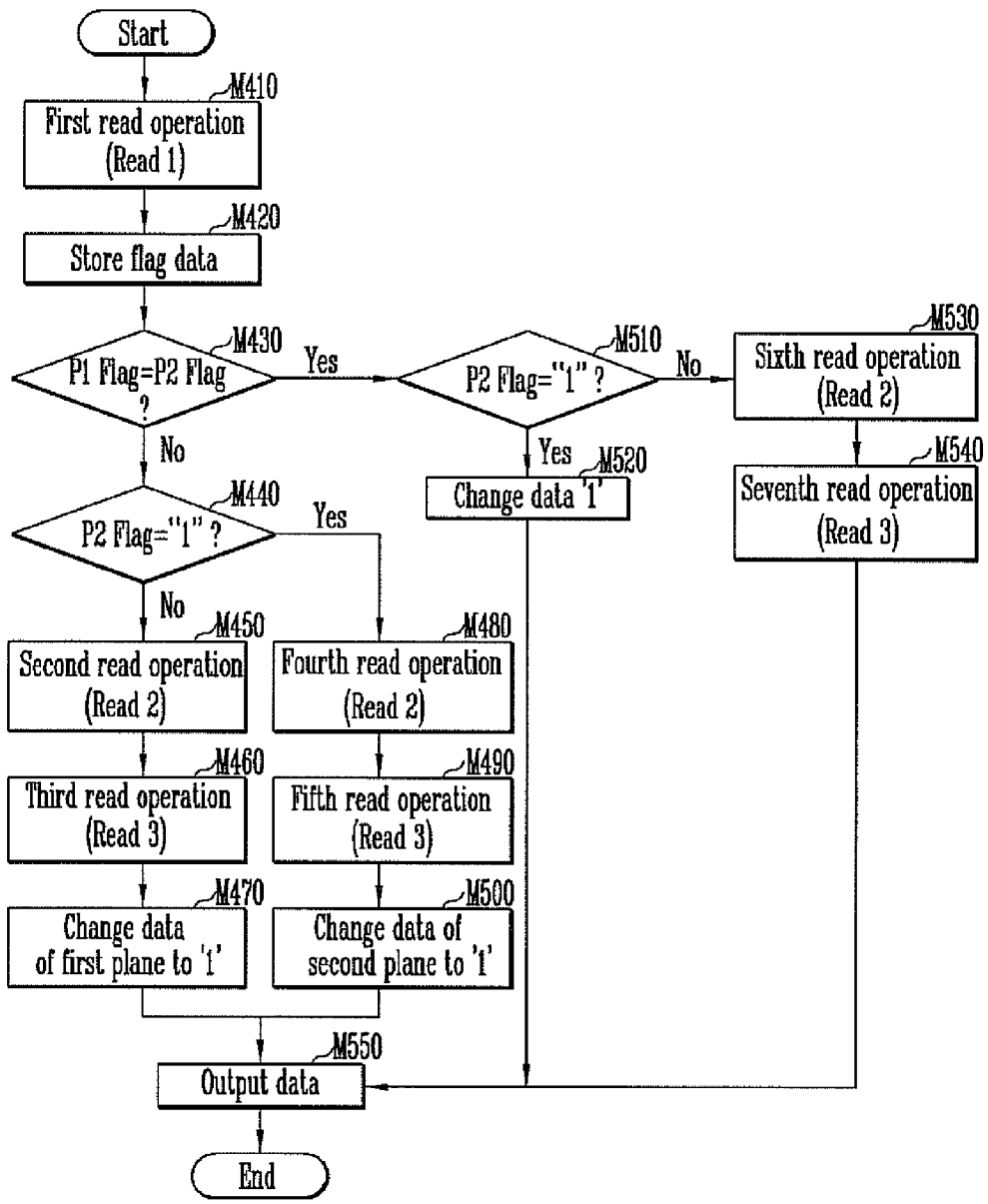
FIG. 5 is a flowchart illustrating a read method for the most significant bit (MSB) pages of the semiconductor memory device according to an exemplary embodiment of this disclosure.

FIG. 5 is a flowchart illustrating a read method for the most significant bit (MSB) pages of the semiconductor memory device according to an exemplary embodiment of this disclosure.

The read method for the most significant bit (MSB) page according to the exemplary embodiment of this disclosure is described below with reference to FIGS. 1, 3, and 5.

(1) First Read Operation—M410

When a most significant bit (MSB) page address is inputted to the semiconductor memory device, a read operation is performed on the most significant bit (MSB) pages of the first and second planes 110, 120.

First, data of the memory cells and the flag cells of the first and second planes 110, 120 is sensed by performing a first read operation using a first read voltage RD1. Here, the pages of the first and second planes 110, 120, having the same page address, are selected and the data of the memory cells and the flag cells of the selected pages is sensed. The sensed data of the memory cells and the flag cells is temporarily stored in the first and second page buffer units 130, 140, respectively.

(2) Store Data of Flag Cells M420

The data of the flag cells stored in the first and second page buffer units 130, 140 is sent to the flag cell data detection unit 310. The flag cell data detection unit 310 sends the received data of the flag cells to the first register 320 and the second register 330, respectively. That is, the data of the flag cells of the first plane 110 is stored in the first register 320, and the data of the flag cells of the second plane 120 is stored in the second register 330.

(3) Compare Data of Flag Cells of First Plane and Data of Flag Cells of Second Plane—M430

The comparison unit 340 determines whether the flag cell data signal Flag-1, indicating the data of the flag cells of the first plane 110 stored in the first register 320, and the flag cell data signal Flag-2, indicating the data of the flag cells of the second plane 120 stored in the second register 330, have the same value and outputs the comparison signal camp. For example, if, as a result of the determination, the flag cell data signal Flag-1 and the flag cell data signal Flag-2 are determined to have the same value, the comparison unit 340 outputs the comparison signal camp of a high level. However, if, as a result of the determination, the flag cell data signal Flag-1 and the flag cell data signal Flag-2 are determined to have different values, the comparison unit 340 outputs the comparison signal camp of a low level.

(4) Determine Data of Flag Cells of Second Plane—M440

If, as a result of the determination at step M430, the flag cell data signal Flag-1 and the flag cell data signal Flag-2 are determined to have different values, it is determined whether the sensed data of the flag cells of the second plane 120 is '1'.

(5) Second Read Operation—M450

If, as a result of the determination at step M440, the data of the flag cells of the second plane 120 is determined not to be '1' (that is, determined to be '0'), it means that the first plane 110 has been programmed by using a least significant bit (LSB) program method, and the second plane 120 has been programmed by sequentially using a least significant bit (LSB) program method and a most significant bit (MSB) program method.

Thus, a second read operation using a second read voltage RD2 is performed. That is, the data of the memory cells of the first and second planes 110, 120 is sensed using the second read voltage RD2 and stored in the respective main latches of the first and second page buffer units 130, 140. Subsequently, the data stored in the main latches is sent to the cache latches of the first and second page buffer units 130, 140 and then outputted.

(6) Third Read Operation M460

A third read operation using a third read voltage RD3 is performed. That is, the data of the memory cells of the first and second planes 110, 120 is sensed using the third read voltage RD3 and stored in the respective main latches of the first and second page buffer units 130, 140. Subsequently, the data stored in the main latches is sent to the cache latches of the first and second page buffer units 130, 140 and then outputted.

(7) Change Data of First Plane to '1'—M470

The data of the first plane 110 read by the second and third read operations is changed to '1'. That is, since the first plane 110 has been programmed by using only the least significant bit (LSB) program method, the most significant bit (MSB) data of the first plane 110 is changed to '1' and outputted, when a most significant bit (MSB) read operation is performed.

(8) Fourth Read Operation—M480

If, as a result of the determination at step M440, the data of the flag cells of the second plane 120 is determined to be '1', it means that the first plane 110 has been programmed by sequentially using a least significant bit (LSB) program method and a most significant bit (MSB) program method, and the second plane 120 has been programmed by using a least significant bit (LSB) program method.

Thus, a fourth read operation using a second read voltage RD2 is performed. That is, the data of the memory cells of the first and second planes 110, 120 is sensed using the second read voltage RD2 and stored in the respective main latches of the first and second page buffer units 130, 140. Subsequently, the data stored in the main latches of the first and second page buffer units 130, 140 is sent to the cache latches thereof and then outputted.

(9) Fifth Read Operation M490

A fifth read operation using a third read voltage RD3 is performed. That is, the data of the memory cells of the first and second planes 110, 120 is sensed using the third read voltage and stored in the respective main latches of the first and second page buffer units 130, 140. Subsequently, the data stored in the main latches of the first and second page buffer units 130, 140 is sent to the cache latches thereof and then outputted.

(10) Change Second Plane Data '1'—M500

The data of the second plane 120 read by the fourth and fifth read operations M480, 490 is changed to '1'. That is, since the second plane 120 has been programmed by using only the least significant bit (LSB) program method, the most significant bit (MSB) data of the first plane 110 is changed to '1' and outputted, when a most significant bit (MSB) read operation is performed.

(11) Determine Data of Second Plane—M510

Meanwhile, if, as a result of the determination at step M430, the flag cell data signal Flag-1 and the flag cell data signal Flag-2 are determined to have the same value, it is determined whether the data of the flag cells of the second plane 120 is '1'.

(12) Change Data to '1'—M520

If, as a result of the determination at step M510, the data of the flag cells of the second plane 120 is determined to be '1', it means that both the first and second planes 110, 120 have been programmed by using a least significant bit (LSB) program method. In this case, both the data of the first and second planes 110, 120, read by the first read operation at step M410, is changed to '1'. That is, both the most significant bit (MSB) data is changed to '1'.

(13) Sixth Read Operation—M530

However, if, as a result of the determination at step M510, the data of the flag cells of the second plane 120 is determined not to be '1' (that is, determined to be '0'), it means that both the first and second planes 110, 120 have been programmed by using a multi-level cell program method. In this case, the data of the memory cells of the first and second planes 110, 120 is read by performing a sixth read operation using a second read voltage RD2 and then outputted.

(14) Seventh Read Operation—M540

Next, the data of the memory cells of the first and second planes 110, 120 is read by performing a seventh read operation using a third read voltage RD2 and then outputted.

(15) Output Data M550

After steps M470, M500, M520, and M540 are performed, the data outputted by the read operations is combined and outputted as most significant bit (MSB) data.

As described above, according to the exemplary embodiments of this disclosure, in case where a first plane and a second plane are programmed by using different program methods in read operations for a least significant bit (LSB) page and a most significant bit (MSB) page, it is first determined as to which one of program methods that the planes have been programmed, and data of the planes is then read on the basis of results of the determination. Accordingly, error in detecting data can be prevented/reduced when data is outputted.

More specifically, in a read operation of a semiconductor memory device including first and second planes, it is first determined whether the first and second planes have been programmed by the same method by comparing data of the flag cells of the first and second planes. Next, a read method corresponding to the program method of each plane is used. Accordingly, error in detecting data can be prevented/reduced in the read operation.

What is claimed is:

1. A semiconductor memory device, comprising:
   planes each configured to comprise flag cells storing data about program methods of memory cells of the plane;
   page buffer units configured to sense the data of the flag cells;
   a flag cell data detection circuit configured to make a determination of program methods of the planes on the basis of a result, obtained by comparing the sensed data of the flag cells of the planes, and the sensed data of the flag cells; and
   a microcontroller configured to control the page buffer units, wherein the page buffer units read least significant bit (LSB) data of the planes or both the least significant bit (LSB) data and most significant bit (MSB) data on the basis of the determination of the flag cell data detection circuit.

2. The semiconductor memory device of claim 1, wherein each of the planes is programmed using a single bit program method or a multi-bit program method.

3. The semiconductor memory device of claim 1, wherein the flag cell data detection circuit comprises:
   a flag cell data detection unit configured to receive the data of the flag cells from the page buffer units;
   a plurality of registers configured to receive the data of the flag cells from the flag cell data detection unit and output the received data as a plurality of flag signals; and
   a comparison unit configured to output a comparison signal by comparing the plurality of flag signals.

4. The semiconductor memory device of claim 3, wherein the microcontroller is further configured to control the page buffer units so that the page buffer units read the least significant bit (LSB) data of the planes or both the least significant bit (LSB) data and the most significant bit (MSB) data of the planes in response to the plurality of flag signals and the comparison signal.

5. The semiconductor memory device of claim 1, wherein the flag cell data detection circuit is further configured to make the determination of the program methods of the planes by determining whether data of a first one of the flag cells is the same as data of a second one of the flag cells.

6. The semiconductor memory device of claim 5, wherein, in response to determining that the first and second flag cells are not equal to one another, the microcontroller is further configured to control the page buffer units to read both the LSB data and the MSB data of the planes.

7. The semiconductor memory device of claim 1, wherein the flag cell data detection circuit is further configured to make the determination by comparing the sensed data of the flag cells of the planes.

8. A read method of a semiconductor memory device, comprising:
   receiving a least significant bit (LSB) page address;
   sensing data of memory cells and data of flag cells that indicates program methods of first and second planes by performing a first read operation and storing the sensed data in first and second page buffer units;
   making a determination of whether the first and second planes have been programmed using an identical program method by comparing the data of the flag cells of the first and second planes;
   in response to determining that the first and second planes have been programmed using the identical program method, reading least significant bit (LSB) data of the first and second planes by performing an identical read operation on the first and second planes; and
   in response to determining that the first and second planes have been programmed using different program methods, reading the least significant bit (LSB) data of the first and second planes by performing different read operations on the first and second planes, respectively.

9. The read method of claim 8, further comprising checking the data of the flag cells of the second plane, after comparing the data of the flag cells of the first and second planes.

10. The read method of claim 9, wherein if the first and second planes are determined to have been programmed using the identical program method, the identical read method is applied to the first and second planes based on the checking of the data of the flag cells of the second plane.

11. The read method of claim 8, wherein if the first or second plane is determined to have been programmed using a least significant bit (LSB) program method, the corresponding data of memory cells sensed by the first read operation is outputted as the least significant bit (LSB) data.

12. The read method of claim 8, wherein if the first or second plane is determined to have been programmed using a most significant bit (MSB) program method, the corresponding data of the memory cells, sensed by performing a second read operation using a second read voltage higher than a first read voltage used in the first read operation, is outputted as the least significant bit (LSB) data.

13. A read method of a semiconductor memory device, comprising:
    receiving a most significant bit (MSB) page address;
    sensing data of memory cells and data of flag cells of first and second planes by performing a first read operation and storing the sensed data in first and second page buffer units;
    making a determination of whether the first and second planes have been programmed using an identical program method by comparing the data of the flag cells of the first and second planes;
    in response to determining that the first and second planes have been programmed using the identical program method, reading most significant bit (MSB) data of the first and second planes by performing an identical second read operation on the first and second planes; and
    in response to determining that the first and second planes have been programmed using different program methods, reading the most significant bit (MSB) data of the first and second planes by performing different read operations on the first and second planes, respectively.

14. The read method of claim 13, further comprising checking the data of the flag cells of the second plane, after comparing the data of the flag cells of the first and second planes.

15. The read method of claim 13, wherein if the first and second planes are determined to have been programmed using the identical program method, the identical read method is applied to the first and second planes based on the checking of the data of the flag cells of the second plane.

16. The read method of claim 15, wherein if one of the first and second planes is determined to have been programmed using a least significant bit program method, the most significant bit (MSB) data having a logical state 1 is outputted for the same plane in performing the second read operation.

17. The read method of claim 13, wherein if the first and second planes are determined to have been programmed sequentially using a least significant bit (LSB) program method and a most significant bit (MSB) program method, the data of the memory cells sensed by the first read operation, data of the memory cells sensed by the second read operation using a second read voltage higher than a first read voltage used in the first read operation, and data of the memory cells sensed by a third read operation using a third read voltage higher than the second read voltage are combined, and the combined data is outputted as the most significant bit (MSB) data.

* * * * *